United States Patent [19]

Bjorke

[11] E Re. 31,145

[45] Reissued Feb. 8, 1983

[54] INTERRUPTABLE SIGNAL GENERATOR

[75] Inventor: Merlin D. Bjorke, Minneapolis, Minn.

[73] Assignee: Honeywell Inc., Minneapolis, Minn.

[21] Appl. No.: 337,217

[22] Filed: Jan. 6, 1982

Related U.S. Patent Documents

Reissue of:

[64] Patent No.: 4,262,222
Issued: Apr. 14, 1981
Appl. No.: 968,534
Filed: Dec. 11, 1978

[51] Int. Cl.[3] ..... H03K 17/28; H03K 5/00

[52] U.S. Cl. ..... 307/608; 307/267; 307/273

[58] Field of Search ..... 307/234, 603, 608, 592, 307/267, 273, 265

[56] References Cited

U.S. PATENT DOCUMENTS 3,226,577 12/1965 Azuma et al. ..... 307/234
3,414,735 12/1968 Harris et al. ..... 307/246
3,659,214 4/1972 Iijima ..... 307/265
3,660,690 5/1972 Theodore ..... 307/265

FOREIGN PATENT DOCUMENTS 1261146 1/1972 United Kingdom .
1449243 9/1976 United Kingdom .
1529103 10/1978 United Kingdom .

*Primary Examiner*—John S. Heyman
*Attorney, Agent, or Firm*—John P. Sumner

[57] ABSTRACT

A circuit comprising a signal generating circuit and an interrupt enable circuit. The signal generating circuit has an input connected to receive a trigger signal and an output for generating an output signal which includes a timing cycle of known duration. The signal generating circuit is responsive to the trigger signal for initiating the timing cycle. The interrupt enable circuit is connected to the signal generating circuit for interrupting the timing cycle in timed relation to an interrupt signal and for reinitiating the timing cycle in timed relation to a reset signal, the interrupt enable circuit being connected to receive the interrupt and reset signals. The output signal begins in timed relation to the start pulse and terminates in timed relation to the end of the timing cycle following interruption.

6 Claims, 2 Drawing Figures

INTERRUPTABLE SIGNAL GENERATOR

Matter enclosed in heavy brackets [ ] appears in the original patent but forms no part of this reissue specification; matter printed in italics indicates the additions made by reissue.

The Government has rights in this invention pursuant to Contract No. DAAB07-77-C2187 awarded by the Department of the Army.

CROSS REFERENCES TO RELATED APPLICATIONS

Reference should be made to my copending application entitled "Digital Delay Generator" which is filed on even date herewith and which is assigned to the same assignee as the present application.

BACKGROUND OF THE INVENTION

1. Field of the Invention

This invention relates to a circuit for generating an output signal having a timing cycle of predetermined duration, the timing cycle having first and second portions separated by an interruption. The duration of the second portion is equal to the predetermined duration of the timing cycle less the duration of the first portion.

2. Description of the Prior Art

My copending application entitled "Digital Delay Generator" describes the use of interruptable signal generating circuitry in order to virtually eliminate the timing jitter normally associated with digital delay generator systems and to obtain delay times in such systems over both integer and non-integer multiples of the time interval between clocked timing pulses. In attempting to locate an interruptable signal generator for use in that application, it was determined that devices such as the present invention were unavailable. Consequently, the present invention was conceived and reduced to practice as part of the efforts associated with the invention discussed in the above mentioned copending application.

SUMMARY OF THE INVENTION

The present invention is an interruptable signal generator comprising a signal generating apparatus and an interrupt enable apparatus. The signal generating apparatus has an input connected to receive a trigger signal and an output for generating an output signal which includes a timing cycle of known duration. The signal generating apparatus is responsive to the trigger signal for initiating the timing cycle. It is also responsive to an interrupt signal received from the interrupt enable apparatus for interrupting the timing cycle and to a reset signal received from the interrupt enable apparatus for reinitiating the timing cycle. The output signal begins in timed relation to the trigger signal and terminates in timed relation to the end of the timing cycle following interruption.

DESCRIPTION OF THE PREFERRED EMBODIMENT

Structure

Figure 1:
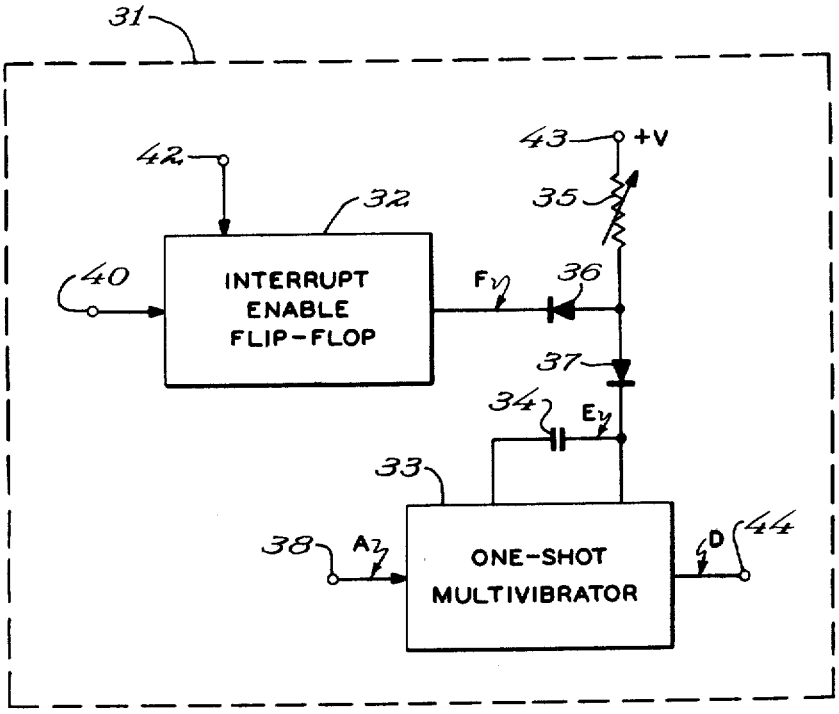
FIG. 1 is a diagram illustrating the preferred embodiment of the present invention.

Referring now more particularly to FIG. 1 and to the details of the present invention, an interruptable signal generator 31 can be seen to be comprised of an interrupt enable flip-flop 32, a one-shot multivibrator ("one-shot") 33, a capacitor 34, a variable resistor 35, two diodes 36 and 37, and a supply voltage terminal 43. The circuit shown has three inputs, namely an input 38 to one-shot 33, a first input 40 to interrupt enable flip-flop 32, and a second input 42 to interrupt enable flip-flop 32. The circuit has a single output 44 at an output of one-shot 33.

An output of interrupt enable flip-flop 32 and a first timing input of one-shot 33 are connected through diodes 36 and 37 which are connected and oriented for forward current flow away from each other. Capacitor 34 is connected between the first timing input of one-shot 33 and a second timing input of one-shot 33. Capacitor charging current is derived from supply voltage terminal 43 which is connected through variable resistor 35 to a junction between diodes 36 and 37.

Interrupt enable flip-flop 32 can comprise an SN5474, and one-shot 33 can comprise an SN54123. These integrated circuits may be found in any TTL data book.

Operation

Referring now to the signals illustrated in FIG. 2, the operation of the interruptable signal generator shown in FIG. 1 will be discussed.

Trigger signal A is transmitted from an external source to input 38 of one-shot 33. One-shot 33 then begins generating an output signal with a timing cycle having a duration predetermined primarily by the values of capacitor 34 and variable resistor 35.

If one-shot 33 were not interrupted, the timing cycle would continue without interruption over the time it takes for the charging current to charge capacitor 34 to a predetermined charge level at which time the output signal of one-shot 33 would terminate. Accordingly, at time $t_0$ when trigger signal A is received at input 38 of one-shot 33, the one-shot output signal begins (see Signal D) as the potential across capacitor 34 begins to rise (see Signal E).

Figure 2:
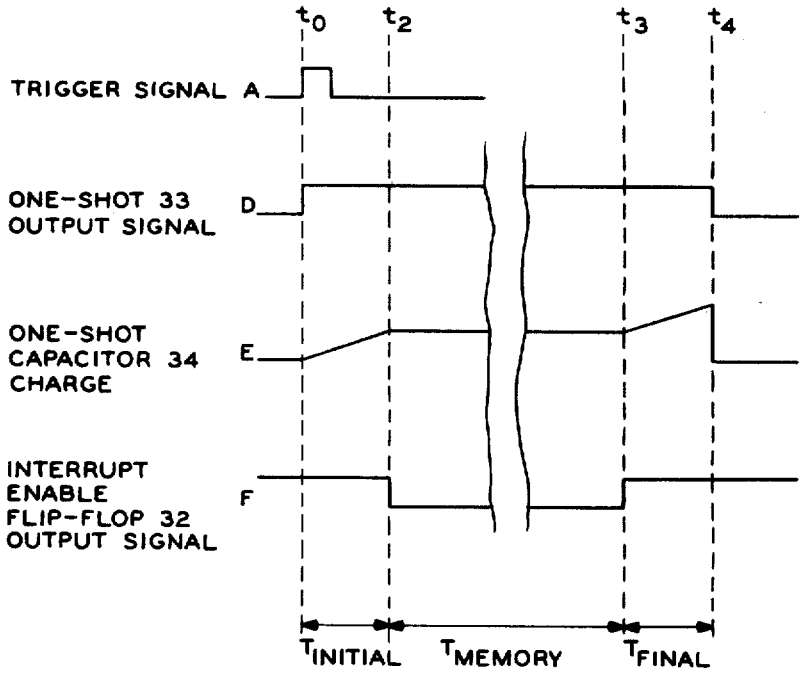
FIG. 2 illustrates signals appearing at various points in the circuit of FIG. 1.

At a specific early time such as $t_2$ in FIG. 2, an interrupt enable command comprising at least a first signal edge is received from an external source by input 40 of the interrupt enable flip-flop 32, thus causing the interrupt enable flip-flop output signal to go from high to low as shown at time $t_2$ in signal F. This low output signal at the output of interrupt enable flip-flop 32 then shunts the one-shot charging current from supply voltage terminal 43 through variable resistor 35 and diode 36 into the output of interrupt enable flip-flop 32 through a transistor leg to ground.

With the capacitor charging current thus shunted, one-shot 33 is effectively in a "memory" mode since no charge or discharge path exists for capacitor 34 (diode 36 prevents any charging of capacitor 34 by the normal output of interrupt enable flip-flop 32, and diode 37 prevents any discharge of capacitor 34). Thus, one-shot 33 will not continue its timing cycle until interrupt enable flip-flop 32 is reset as discussed further below.

Although the means including diodes 36 and 37 could have been constructed in a wide variety of ways, including through the use of transistors, the use of diodes was selected.

At a specific later time, such as time $t_3$ in FIG. 2, a reset signal is received from an external source by input 42 of interrupt enable flip-flop 32. Receipt of the reset signal causes interrupt enable flip-flop 32 to be reset and its output to return high as shown at time $t_3$ in signal F.

With interrupt enable flip-flop 32 in its reset state, the high output signal precludes further shunting of the capacitor charging current to ground. Thus, capacitor 34 once again begins charging (see signal E at time $t_3$), and one-shot 33 resumes the remaining portion of its timing cycle. The remaining portion will be its normal full cycle time less the amount of time that occurred between trigger signal A at time $t_0$ and the interrupt enable command at time $t_2$.

The timing cycle of one-shot 33 ends when the charge on capacitor 34 reaches a predetermined threshold. At this time, as illustrated at time $t_4$ in FIG. 2, capacitor 34 discharges (see signal E) and the one-shot 33 output signal terminates (see Signal D).

As shown in FIG. 2, the total time between time $t_0$ and time $t_4$ is the total of time periods $T_{INITIAL}$, $T_{MEMORY}$, and $T_{FINAL}$.

$T_{INITIAL}$ is the first portion of the one-shot 33 timing cycle. It occurs between time $t_0$ at the leading edge of start pulse A and time $t_2$ at which time the interrupt enable command is received from an external source by interrupt enable flip-flop 32, thus causing the one-shot 33 timing cyle to be interrupted.

$T_{MEMORY}$ is the time period during which the one-shot 33 timing cycle is effectively in a "memory" mode. It is the time period between time $t_2$ when the one-shot 33 timing cycle is interrupted and time $t_3$ when the reset signal is received from an external source in order to reset interrupt enable flip-flop 32, thus recommencing the charging of capacitor 34 and the timing of the one-shot 33 timing cycle.

$T_{FINAL}$ is the final or remaining portion of the one-shot 33 timing cycle and is equal to the normal one-shot 33 cycle time less the amount of time that occurred during $T_{INITIAL}$. It occurs between time $t_3$ when the reset signal resets interrupt enable flip-flop 32, thus causing the one-shot 33 timing cycle to resume, and time $t_4$, when one-shot 33 reaches the end of its timing cycle.

The selection of times $t_2$ and $t_3$ as the respective times to toggle and reset interrupt enable flip-flop 32 is, of course, arbitrary and can be varied according to design considerations and applications. A primary concern is to have the time period between times $t_0$ and $t_2$ and the time period between times $t_3$ and $t_4$ long enough so that any transients arising at times $t_0$ and $t_3$ will have suitably stabilized by times $t_2$ and $t_4$, respectively.

The normal full cycle time of one-shot 33 ($T_{INITIAL}$ plus $T_{FINAL}$) can vary according to design considerations. Times as long as microseconds have been experimented with. In two different applications of the present invention, cycle times were approximately 350 nanoseconds and were adjustable by approximately 50 nanoseconds in one application and by approximately 100 nanoseconds in the other application. (The cycle time of one-shot 33 was made adjustable through the use of variable resistor 35. Note that, in addition to or in the alternative to using a variable resistor 35 to adjust the cycle time, a variable capacitor could be used in lieu of capacitor 34).

$T_{MEMORY}$, the time during which one-shot 33 is interrupted and held in its "memory" mode, can be as long as desired. In two applications of the present invention $T_{MEMORY}$ was approximately 52 microseconds.

In the preceding discussion, times have generally been referred to as occurring at particular times such as $t_0$, $t_2$, $t_3$, and $t_4$. In reality, of course, there is virtually always some inherent delay within the components of a system as well as over signal rise times. If all such delays are equal or are known, the resulting uncertainty, if significant, can be accounted for. In addition, of course, one can insert known delays in timed relation to times such as those mentioned above and still have an equivalent system since the effect of such delays can be accounted for.

The embodiments of the invention in which an exclusive property or right is claimed are defined as follows:

1. An interruptable signal generator comprising:

first means having an input connected to receive a trigger signal and an output for generating an output signal which includes a timing cycle of a fixed known duration, the first means being responsive to the trigger signal for initiating the timing cycle, the output signal beginning in timed relation to the start pulse and terminating in timed relation to the end of the timing cycle; and second means connected to the first means for *randomly* interrupting the timing cycle [for an indefinite period] *for up to an indefinite period*, the interruption [being] *beginning* in timed relation to an interrupt signal edge, and for reestablishing the timing cycle in timed relation to a reset signal edge, thus permitting the timing cycle to continue, the second means being connected to receive the interrupt and reset signal edges.

2. Apparatus according to claim 1 wherein the first means further comprises a one-shot multivibrator having an input for receiving the start pulse and an output for providing the output signal, the one-shot multivibrator also having a timing capacitor connected between a first timing input and a second timing input.

3. Apparatus according to claim 2 wherein the second means further comprises an interrupt enable flip-flop having an output connected to a third means for selectively permitting the charging of the capacitor, the third means being connected to the capacitor, and wherein the interrupt enable flip-flop is connected to receive the interrupt and reset signal edges, the interrupt enable flip-flop output having a normal first signal level ending in response to the interrupt signal edge and recommencing in response to the reset signal edge, and having a second signal level between the ending and recommencing of the first signal level, the charging of the capacitor occurring following the start pulse while the first signal level is present until the capacitor charge reaches a known level, the timing cycle ending in timed relation to the time that the capacitor reaches the known level.

4. Apparatus according to claim 3 wherein the third means includes a resistor through which the capacitor is charged.

5. Apparatus according to claim 4 wherein the third means further comprises two diodes connected for current flow away from each other, the diodes being connected between the interrupt enable flip-flop output and the timing capacitor and wherein one end of the resistor is connected to a junction between the two diodes, the other end of the resistor being connected to a terminal adapted to receive a supply voltage.

6. Apparatus according to claim 5 wherein the interrupt enable flip-flop further comprises a first input connected to receive the interrupt signal edge and a second input for receiving the reset signal edge.

* * * * *